United States Patent [19]

Murari et al.

[11]  4,181,878
[45]  Jan. 1, 1980

[54] INTEGRATED-CIRCUIT CHIP WITH VOLTAGE DIVIDER

[75] Inventors: Bruno Murari, Monza; Silvano Coccetti, Vittuone, both of Italy

[73] Assignee: SGS-ATES Componenti Elettronici S.p.A., Milan, Italy

[21] Appl. No.: 902,282

[22] Filed: May 3, 1978

[30] Foreign Application Priority Data

May 4, 1977 [IT] Italy .................. 23145 A/77

[51] Int. Cl.$^2$ .................. H01L 27/04; H01C 1/14
[52] U.S. Cl. .................. 323/94 R; 357/20; 357/51
[58] Field of Search .................. 357/51, 27, 48; 307/303, 309; 323/94 R

[56] References Cited

U.S. PATENT DOCUMENTS 3,666,995  5/1972  Wensink et al. .................. 357/51
4,028,718  6/1977  Migitaka et al. .................. 357/27

FOREIGN PATENT DOCUMENTS 1416220  12/1975  United Kingdom .

OTHER PUBLICATIONS

Dorler et al., IBM Technical Disclosure Bulletin, vol. 15, Apr. 1973, p. 3383.
Ting et al., Solid-State Electronics, vol. 14, pp. 433-338 (1971).

Primary Examiner—William D. Larkins
Attorney, Agent, or Firm—Karl F. Ross

[57]  ABSTRACT

A voltage divider with at least two intermediate taps of almost the same potential is formed in an integrated-circuit chip by diffusing P-type impurities into an N-type substrate along a narrow strip zone ending in enlarged terminal areas. The strip zone has at least two narrower transverse branches which form closely adjoining junctions with it and extend laterally in the same or in opposite directions. Upon application of a voltage difference across the strip zone by means of electrodes placed on the two terminal areas, output terminals in contact with the free ends of the branches remote from the strip zone and connected to high-resistance loads carry potentials substantially equal to those of the corresponding junctions.

3 Claims, 5 Drawing Figures

INTEGRATED-CIRCUIT CHIP WITH VOLTAGE DIVIDER

FIELD OF THE INVENTION

Our present invention relates to monolithic integrated circuitry and more particularly to a resistive voltage divider forming part of an IC chip.

BACKGROUND OF THE INVENTION

The formation of resistors in integrated circuitry generally proceeds by covering a surface of a substrate of semiconductor material of a given conductivity type, e.g. N-type silicon, with a passivating layer (e.g. of silicon dioxide) having an elongate cutout through which impurities can be diffused into the substrate to produce a strip zone of the opposite conductivity type. The usually enlarged extremities of that strip zone are then contacted by a pair of input electrodes connected across a voltage source. Output terminals contacting the strip zone at intermediate locations carry stepped-down voltages which correspond to fractions of the supply voltage and can be used for the energization of loads included in the integrated circuit or separated therefrom.

The resistance R of such a strip zone can be expressed, in first approximation, by the equation $$R = R_S \cdot L/W$$

where $R_S$ is the surface or sheet resistivity of the zone, L is its length and W is its width. The resistivity $R_S$, depending on the degree of doping, is frequently determined by the requirements of other circuit components since, for convenience, it is customary to form such resistive zones simultaneously with the bases of junction transistors or with the source and drain electrodes of MOSFETs included in the chip. Thus, the resistance R is essentially a function of the dimensions L and W which must be chosen with great precision. This necessitates a careful design of the mask used for making the cutout in the passivating layer, along with proper dosing of the impurities, in order to keep the resistance R within acceptable tolerance limits of, say, ±3%. Equally important, in the case of a voltage divider, is the accurate positioning of the tap or taps whose presence between the extremities of the strip zone modifies its physical and geometrical properties, thus altering the resistance R to an extent which is difficult to evaluate quantitatively especially with a plurality of such taps.

Voltage dividers easier to calculate can be made from several individual resistors, represented by respective strip zones, connected in various series and/or parallel configurations. Such resistor arrays, however, necessarily occupy a relatively large surface area of an IC chip and are therefore incompatible with a desirable miniaturization of integrated circuitry.

OBJECT OF THE INVENTION

The object of our present invention is to provide a compact IC voltage divider which obviates the aforestated difficulties and allows fractional voltages of nearly identical magnitudes to be tapped off.

SUMMARY OF THE INVENTION

We realize this object, in accordance with our present invention, by providing an elongate strip zone of the aforedescribed type with at least two transverse branches forming closely adjoining junctions therewith which are spaced from the strip extremities. The free ends of these branches are in contact with respective output terminals which, when connected to loads of high input impedance, carry fractional voltages substantially equal to those of their respective junctions.

Since our invention eliminates the need for placing the output terminals in direct contact with the strip zone, the taps of the voltage divider can be located as close to one another as desired. If necessary, the branches can extend from opposite sides of the strip zone. Inasmuch as high-resistance loads (e.g. the inputs of operational amplifiers) draw only negligible current, the branches can be made considerably narrower than the strip zone without introducing significant voltage drops between the junctions and the output terminals.

BRIEF DESCRIPTION OF THE DRAWING

The above and other features of our invention will now be described in detail with reference to the accompanying drawing in which.

SPECIFIC DESCRIPTION

Figure 1:
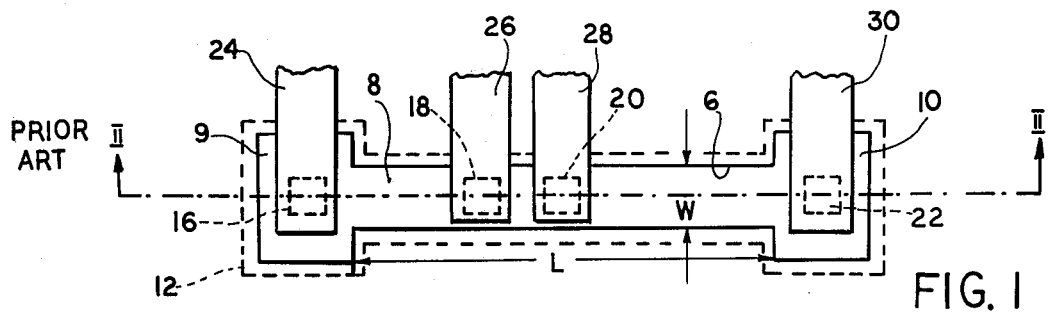
FIG. 1 is a diagrammatic plan view, on an enlarged scale, of a conventional voltage divider forming part of an IC chip.
Figure 2:
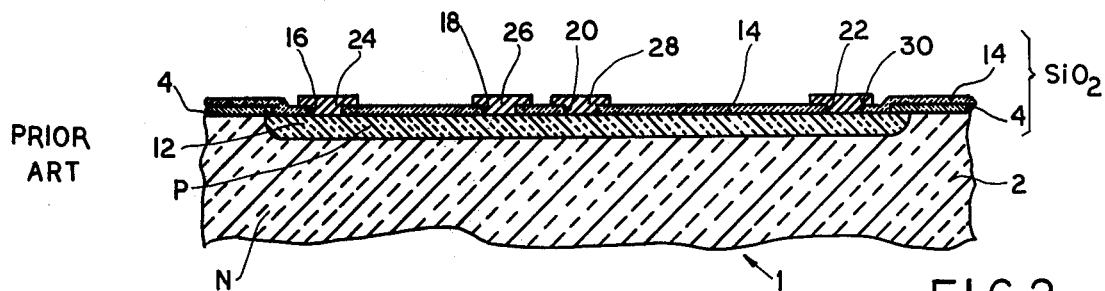
FIG. 2 is a cross-sectional view taken on the line II—II of FIG. 1.

In FIGS. 1 and 2 we have shown a prior-art voltage divider formed on a silicon wafer 1 which comprises an N-type substrate 2. A passivating SiO$_2$ layer 4 is grown on the substrate 2 and is partially removed, as by a photolithographic process, to leave a cutout 6 exposing an elongate zone 8 of the substrate. This zone 8, having enlarged extremities or heads 9 and 10, is doped with P-type impurities to form a resistive layer 12; that operation may be accompanied, as noted above, by the formation of other circuit elements in nonillustrated parts of the substrate. Thereafter, a further silica layer 14 is grown over the entire wafer and is then partly removed to form apertures 16 and 22 above heads 9 and 10 as well as apertures 18 and 20 along intermediate points or taps of zone 8; FIG. 1 shows the zone as having a length L and a width W. Finally, metallic input electrodes 24 and 30 as well as output terminals 26 and 28 are deposited on layer 14 and caused to penetrate the underlying apertures 16, 22 and 18, 20 so as to contact the P-type layer 12 at its extremities and at its intermediate taps, respectively.

Let us assume, by way of example, that layer 12 has a surface resistivity $R_S = 200\Omega$/square, with $L = 900\mu$ and $W = 15\mu$. In accordance with the foregoing equations, this yields an overall resistance $R = 12K\Omega$. Obviously, the width of apertures 18 and 20 (required to provide the necessary contact area) dictates a certain minimum spacing of the taps in the longitudinal direction of zone 8; moreover, the proximity of terminal strips 26 and 28 to each other and to the zone 8 may give rise to an undesirable leakage current as well as to objectionable capacitive effects.

Figure 3:
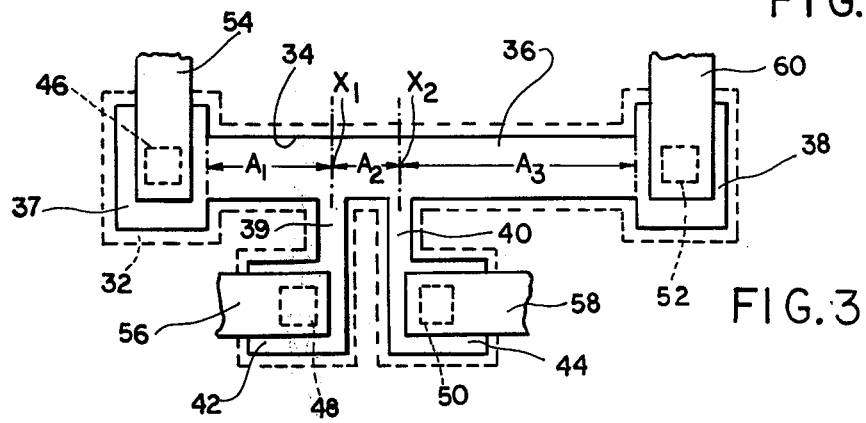
FIG. 3 is a view similar to FIG. 1 but illustrating an improved voltage divider according to our invention.

In FIG. 3 we have illustrated an improved voltage divider according to our invention in which a P-type layer 32, formed in an N-type substrate such as the one shown at 2 in FIG. 2, substantially registers with a cutout 34 in an overlying silica layer (not shown but corresponding to layer 4 in FIG. 1) defining an elongate strip zone 36 with heads 37 and 38. Two transverse branches 39 and 40 extend laterally from zone 36 at junctions $X_1$ and $X_2$. Branches 39 and 40, which are part of layer 32 and therefore have the same surface resistivity $R_S$ as zone 36, have enlarged free ends 42 and 44 overlain by output terminals 56 and 58 which contact them through respective apertures 48 and 50 in a further silica layer corresponding to layer 14 of FIG. 2. Other apertures 46 and 52 in the latter layer allow a pair of input electrodes 54 and 60 to contact the heads 37 and 38 of the strip zone.

The voltage divider of FIG. 3 has a section $A_1$ between extremity 37 and junction $X_1$, a section $A_2$ between junctions $X_1$ and $X_2$, and a section $A_3$ between junction $X_2$ and extremity 38. These sections have respective resistances $R_1$, $R_2$ and $R_3$ diagrammatically illustrated in FIG. 4 which also shows input terminal 54 as grounded and input terminal 60 as energized with a supply voltage $+E$. The resistances of branches 39 and 40 have been designated $R_4$ and $R_5$ in FIG. 4; output terminals 56 and 58 are shown connected to respective high-resistance loads $Z_1$ and $Z_2$ grounded at their other terminals.

Let us assume, by way of example, that the source voltage $=E$ equals 12 V and that it is desired to tap off a fractional voltage $E_1=4$ V at junction $X_1$ and a fractional voltage $E_2=4.05$ V at junction $X_2$. If the overall resistance R of the voltage divider is again equal to 12KΩ, zone 36 is tranversed by a current of 1mA. The desired voltge distribution then calls for resistances $R_1=4000\Omega$, $R_2=50\Omega$ and $R_3=7950\Omega$. With $A_1+A_2+A_3=L=900\mu$, as in the case previously discussed, the lengths of the several divider sections will be $A_1=300\Omega$, $A_2\approx 4\mu$ and $A_3\approx 596\mu$. Such a spacing of junctions $X_1$ and $X_2$, greatly exaggerated in FIG. 3 for the sake of clarity, is easily realizable if the width of branches 39 and 40 amounts to 2 or 3μ, for example, thus to a small fraction of the width W of zone 36 again assumed to equal 15μ.

Figure 5:
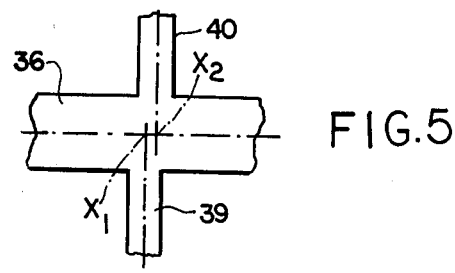
FIG. 5 is a fractional plan view showing a partial modification of the divider of FIG. 3.

An even closer spacing of junctions $X_1$ and $X_2$ from each other is possible if, as shown in FIG. 5, the branches 39 and 40 extend in opposite directions from strip zone 36. In a limited case, these oppositely extending branches may be aligned so that their junctions $X_1$ and $X_2$ coincide.

In view of the high resistance of loads $Z_1$ and $Z_2$, the current flow through branches 39 and 40 is negligible so that terminals 56 and 58 are substantially energized with the junction voltages $E_1$ and $E_2$, respectively.

Figure 4:
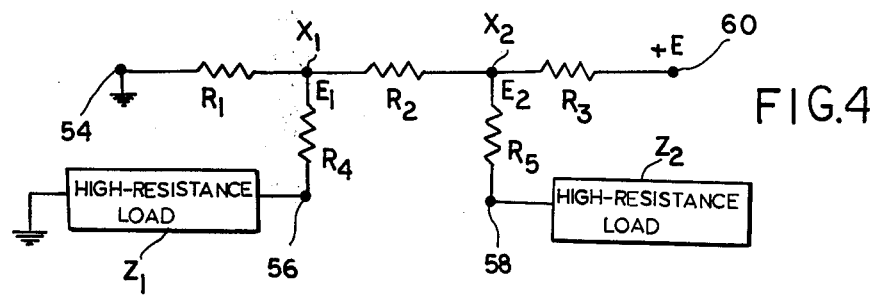
FIG. 4 is an equivalent-circuit diagram for the voltage divider of FIG. 3.

Naturally, our improved voltage divider may be provided with more than two taps, not all of them necessarily paired as shown in FIGS. 3-5.

We claim:

1. A voltage divider forming part of a monolithic integrated circuit, comprising:
 a semiconductor substrate of one conductivity type provided at a surface thereof with an elongate strip zone of the opposite conductivity type terminating in enlarged extremities, said strip zone being provided with at least two transverse branches of the same surface resistivity as said strip zone forming closely adjoining junctions therewith spaced from said extremities, said branches having free ends remote from said strip zone and being narrower than the latter;
 a pair of input electrodes in contact with said extremities connected across a voltage source; and
 output terminals in contact with said free ends and connected to respective high-impedance loads for energizing same with fractional voltages substantially equal to those of said junctions.

2. A voltage divider as defined in claim 1 wherein the free ends of said branches are enlarged.

3. A voltage divider as defined in claim 1 or 2 wherein said branches extend in opposite directions from said strip zone.

* * * * *

UNITED STATES PATENT AND TRADEMARK OFFICE
CERTIFICATE OF CORRECTION

PATENT NO. : 4,181,878

DATED : January 1, 1980

INVENTOR(S) : Bruno Murari; Silvano Coccetti

It is certified that error appears in the above-identified patent and that said Letters Patent is hereby corrected as shown below:

In column 3, line 29, please delete "=" and substitute therefor --+--.

In column 3, line 38, please delete "300$\Omega$" and substitute therefor --300$\mu$--.

Signed and Sealed this

Ninth Day of June, 1992

Attest:

DOUGLAS B. COMER

*Attesting Officer*     *Acting Commissioner of Patents and Trademarks*